United States Patent [19]

Mihara

[11] Patent Number: 5,079,190
[45] Date of Patent: Jan. 7, 1992

[54] METHOD OF ELIMINATING UNEVEN REFRACTIVE INDEX IN RESIN OF A RESIN ENCAPSULATED PHOTOELECTRIC CONVERTING DEVICE

[75] Inventor: Akio Mihara, Atsugi, Japan
[73] Assignee: Canon Kabushiki Kaisha, Tokyo, Japan
[21] Appl. No.: 308,023
[22] Filed: Feb. 9, 1989
[30] Foreign Application Priority Data Feb. 9, 1988 [JP] Japan .................... 63-028137
Feb. 8, 1989 [JP] Japan .................... 1-029042

[51] Int. Cl.⁵ .............. H01L 21/56; H01L 21/58; H01L 21/60
[52] U.S. Cl. .................... 437/220; 437/214; 437/211
[58] Field of Search ............ 357/72; 437/211, 217, 437/219, 224, 214; 29/841, 855; 136/259

[56] References Cited

U.S. PATENT DOCUMENTS 4,063,993 12/1977 Burns .................... 437/217

FOREIGN PATENT DOCUMENTS 0084448 5/1984 Japan .................... 437/217

*Primary Examiner*—Olik Chaudhuri
*Assistant Examiner*—David E. Graybill
*Attorney, Agent, or Firm*—Fitzpatrick, Cella, Harper & Scinto

[57] ABSTRACT

A method for producing a resin-sealed photoelectric converting device which eliminates the problem of uneven resin refractive index produced when the resin is injected past the lead wires and over the light receiving elements. The photoelectric converting device has a photoelectric converting element, and wires for electrically connecting electrodes of the photoelectric converting element with lead electrodes. A transparent portion is present on the light receiving portion of the photoelectric converting element. The method includes the steps of placing the photoelectric converting element and the lead electrodes in a mold cavity having a resin-injecting gate; and injecting resin from the gate and guiding the injected resin which bypasses said wires to an area away from the photoelectric converting portion, and sealing the entire photoelectric converting element with the injected resin. Since the resin which bypasses the wires does not cover the light receiving portion, any unevenness in the resin will not produce an uneven refractive index over the light receiving portion.

26 Claims, 6 Drawing Sheets

METHOD OF ELIMINATING UNEVEN REFRACTIVE INDEX IN RESIN OF A RESIN ENCAPSULATED PHOTOELECTRIC CONVERTING DEVICE

BACKGROUND OF THE INVENTION

1. Field of the Invention

The present invention relates to a method for manufacturing a photoelectric converting device sealed with translucent resin, such as photosensor, solar cell, light-emitting device or the like.

2. Related Background Art

Resin-sealed semiconductor devices, such as solid-state image sensors, have been manufactured in the following manner. As shown in FIGS. 1 and 2, a semiconductor element 32 fixed on a substrate 31 is provided with electrode pads 39. Around said semiconductor element 32 there are provided internal leads 33. Said electrode pads 39 and internal leads 33 are electrically bonded with metal wires 34, and, after the assembly is placed in a sealing mold 41, sealing resin is injected therein.

In such a method, the injection gate for the sealing resin has to be in a broken-lined position 37a or 37b in FIG. 2, in order to eliminate any unfilled portion in the mold 41. There are provided air vents 44 as shown in FIG. 2, in order to remove the air from the cavity.

However, if the resin injecting gate is positioned at 37a or 37b in a photoelectric converting device, such as a CCD, solely in consideration of eliminating the unfilled portion, the fluid translucent resin injected from said gate touches the wires 34 present between said gate and a light-receiving area 36, and the state of flow of the resin is therefore influenced.

Consequently, after the solidification of the resin, there is generated an area 38 with an uneven refractive index, extending even to the light-receiving area of the photoelectric converting device.

FIG. 3 is an enlarged view of an area 38 of uneven refractive index generated in the vicinity of a wire 34. Arrows 40 in FIGS. 2 and 3 indicate the flow of the translucent resin injected from the gate.

Thus the wire 34 constitutes a stagnation point in the flow of the translucent resin, causing a change in the flow thereof. Because of such change in the flow, the area 38 of uneven refractive index extends to the light-receiving area 36 on the solid-state image sensor. As a result, in such a photoelectric converting device, the incident light to be detected in the light-receiving area 36 through the translucent resin is improperly refracted or scattered.

Consequently the light to be received by each pixel in the light-receiving area 36 may be decreased in intensity, or erroneously introduced into other pixels.

In a system of which a function is controlled through the measurement of intensity or distribution of light within a photoelectric converting device such as a solid-state image sensor, such a phenomenon gives rise to an erroneous operation of the system. For example, in case a distance measuring sensor for an automatic focusing single-lens reflex camera is composed of a photoelectric converting device composed of a solid-state image sensor sealed in transparent epoxy resin, such a phenomenon results in an aberration of the focusing operation, so that properly focused photographs cannot be obtained.

As an example, let us consider a case of a photoelectric converting device having a light-receiving area formed as two serial rows on a same chip, each row having 48 pixels of 30 $\mu m \times 150$ $\mu m = 4500$ $\mu m^2$ each, and capable of measuring the distribution of light intensity even under a low illumination of $EV = 1-2$. According to the focusing measurement using the solid-state image sensor, the focusing operation is conducted by forming the same image of an object on two photosensor rows through a photographing lens and a glasses lens as a secondary imaging lens or re-imaging lens, which comprises two lens like a glasses, and then moving the photographing lens in a position where the difference between the light intensity distributions detected by said two photosensor rows becomes zero, thus obtaining the focused state (not shown).

Consequently errors in the measurement of the focus state will occur if such a solid-state image sensor contains an area of aforementioned uneven refractive index in the light path in the transparent sealing epoxy resin, leading to the light receiving area.

Such errors in the measurement of the focus state may also appear as a distortion in the photographed image, in case of an area sensor having a two-dimensionally wide light-receiving area as a light-receiving portion.

Further, in case this photoelectric covnerting device is a light-emitting element and used in a semiconductor laser or the like, the rectilinear propagation properties of the light may be damaged because of the area of uneven refractive index.

SUMMARY OF THE INVENTION

In consideration of the foregoing drawbacks, an object of the present invention is to provide a method for producing a photoelectric converting device, capable of preventing formation of an area with uneven refractive index on the photoelectric converting area.

Another object of the present invention is to provide a method for producing a photoelectric converting device capable, in the injection of sealing resin, of preventing formation of an unfilled portion.

Still another object of the present invention is to provide a method capable of producing a photoelectric converting device of a simple structure with satisfactory optical characteristics.

Still another object of the present invention is to provide a molding apparatus enabling the exploitation of the above-mentioned producing method.

Still another object of the present invention is to provide a photoelectric converting device which is inexpensive and excellent in optical characteristics.

DETAILED DESCRIPTION OF THE PREFERRED EMBODIMENTS

According to the present invention, in a photoelectric converting device with a wire bonding area, the positional relationship of the wire bonding area, a photoelectric converting area, and a resin injecting gate is so defined that the resin injected from said gate into a cavity and passing through said wire bonding area flows outside said photoelectric converting area, whereby the photoelectric converting area is excluded from the flow of the resin which has passed through the wire bonding area.

Also, the uneven flow of resin caused by wires is eliminated by the use of bumps (composed of a metal such as Au, Ag, Al, Pb, Sn or Bi or an alloy thereof) as the connecting members.

In the following, the present invention will be clarified by embodiments shown in the attached drawings. It is to be understood that the present invention is not limited to the following embodiments but can assume any structure that can achieve the objects of the present invention. More specifically the form of the photoelectric converting device, electrodes, and lead electrodes may be suitably selected.

Figure 1:
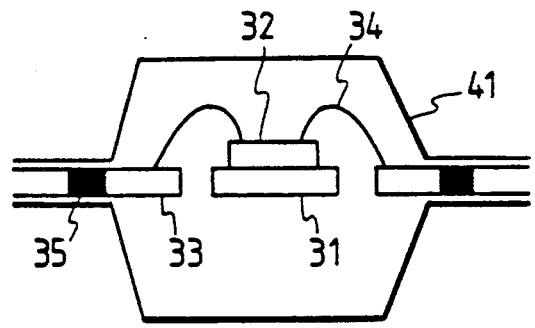
FIG. 1 is a schematic cross-sectional view of a photoelectric converting device in which the present invention is applicable.
Figure 2:
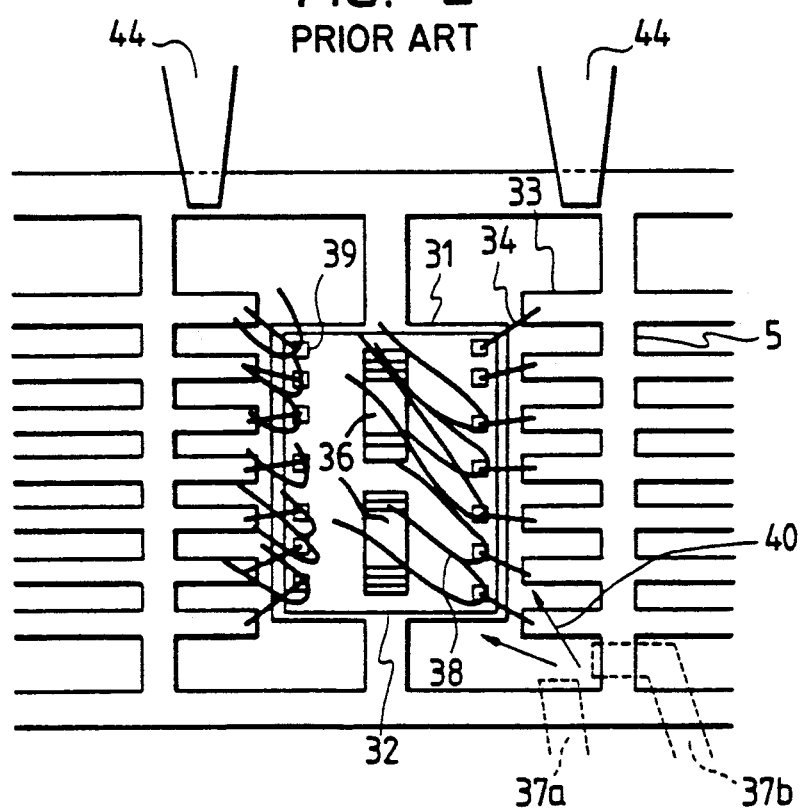
FIG. 2 is a schematic view for explaining the conventional method for producing photoelectric converting device.
Figure 3:
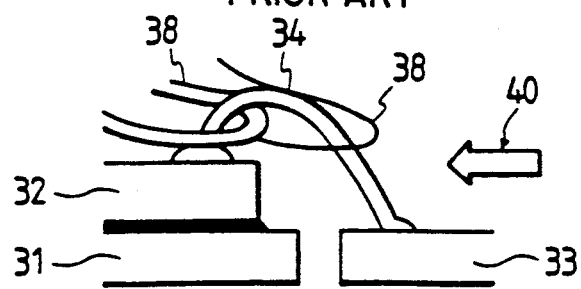
FIG. 3 is a schematic partial magnified view of a wire bonding part as shown in FIG. 2.
Figure 4:
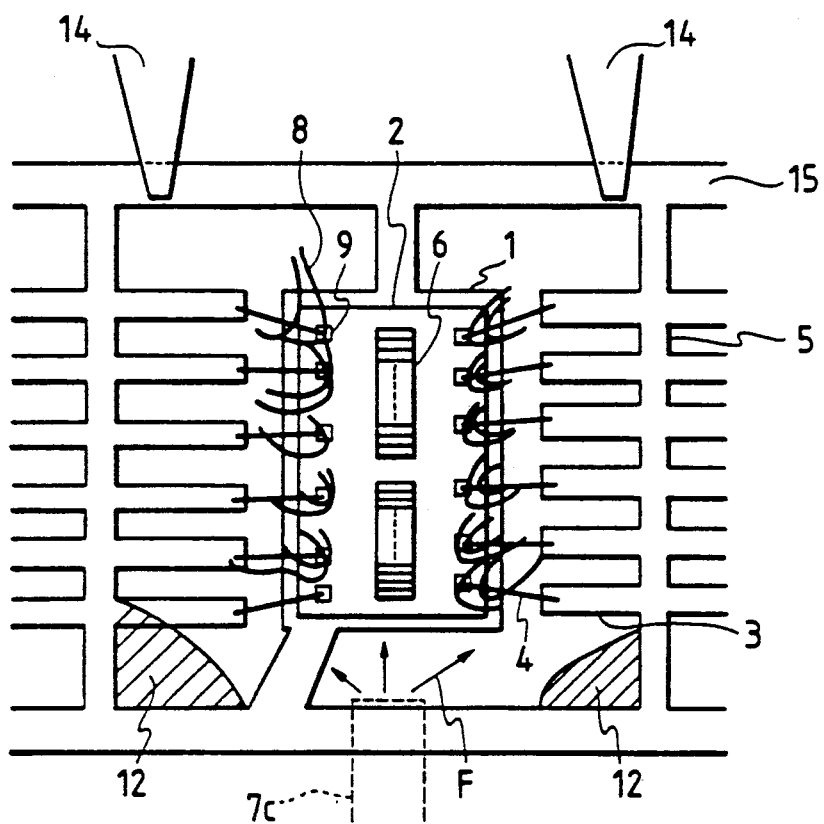
FIG. 4 is a schematic view for explaining the method of producing photoelectric converting device of the present invention.

FIG. 4 is a schematic plan view best representing the features of the method for producing the photoelectric converting device of the present invention, wherein, the aforementioned solid-state image sensor as the photoelectric converting element is advantageously employable as the distance measuring sensor for an automatic focusing type single-lens reflex camera.

In FIG. 4 there are shown a gate 7c for introducing transparent epoxy resin serving as the translucent resin, into a mold or cavity 11; electrode pads 9 of the solid-state image sensor; internal leads 3 of the photoelectric converting device; metal wires 4; an island 1 serving as a substrate for supporting the solid-state image sensor 2; a light-receiving area 6 of the solid-state image sensor; an area 8 of uneven refractive index; a lead frame 15; and air vents 14 for removing air from the cavity 11, and an arrow F designates the flow of the transparent epoxy resin injected from the gate 7c.

Figure 5A:
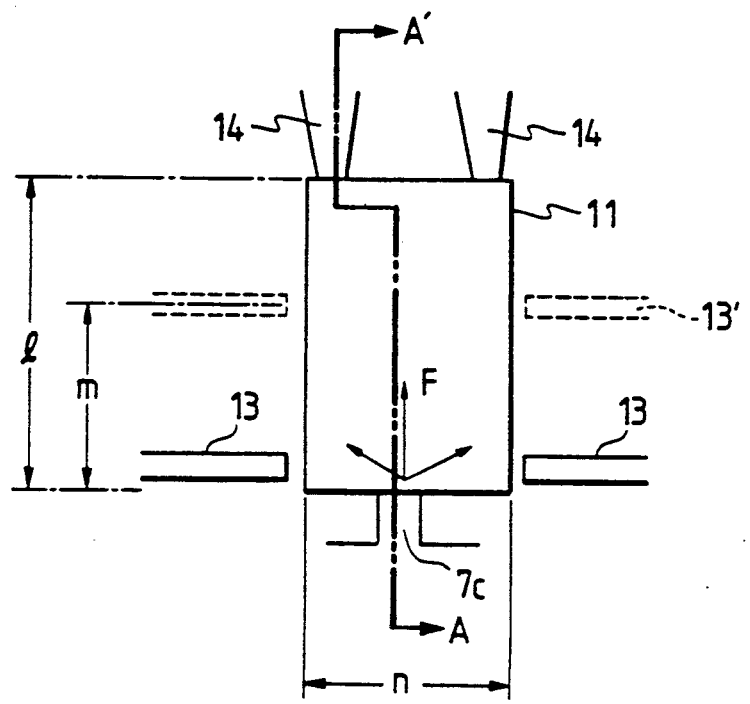
FIG. 5A is a schematic plan view of an apparatus for producing a photoelectric converting device, corresponding to FIG. 4.

FIG. 5A is a schematic plan view of a molding apparatus for producing a photoelectric converting device by sealing a semiconductor chip with resin according to the method explained above, and FIG. 5B is a schematic cross-sectional view of said apparatus along a line A—A' in FIG. 5A.

Steps of the producing method will be explained with reference to FIGS. 5A and 5B. At first the solid-state image sensor 2 is placed at a predetermined position of the lead frame 15, and the electrode pads 9 of the solid-state image sensor 2 and the internal leads 3 of the lead frame 15 are electrically bonded with metal wires such as gold, by means of a wire bonding apparatus (not shown).

Then a desired portion of the lead frame 15, including the solid-state image sensor 2, metal wires 4 and internal leads 3, is placed in a mold or cavity 11, and transparent epoxy resin is injected from the gate 7c, replacing the air in said cavity and filling the space therein.

The air present in the cavity 11 is discharged from the air vents 13, 14. The resin flows as indicates by arrows F in FIGS. 4 and 5A.

If the air vents 13 are not present, the injection of the transparent epoxy resin from the gate 7c may generate unfilled portions as represented by hatched areas 12 in FIG. 4. In the present embodiment, in addition to the air vents 14, there are provided additional air vents 13 in lateral front positions, seen from the gate, as shown in FIG. 5A. It is thus made possible to prevent formation of unfilled portions, or voids in the sealing resin of the photoelectric converting device. Said air vents are preferably positioned as shown in FIG. 5A, but they may also be provided in broken-lined positions 13' shown in FIG. 5A, according to the experiments of the present inventor.

The position of said additional air vents 13 or 13' should satisfy a relation:

$$3m \leq l$$

wherein is the length of the cavity 11, and m is the effective distance from the center of the exit of the gate 7c to said air vents along the direction of the length of said cavity.

Preferably, it also satisfies a relation:

$$2m \leq n$$

wherein n is the effective width of said cavity in a direction perpendicular to said direction of length.

Naturally, it is most preferable that the above-mentioned two conditions are simultaneously satisfied.

In the embodiment explained above, the gate 7c is positioned at the approximate center of a cavity wall corresponding, among four sides of the solid-state image sensor, to a side not provided with metal wires. Thus, the transparent epoxy resin injected from said gate at first flows into the light-receiving area of the image sensor, then toward the metal wires and finally toward the air vents 14. Consequently, the area of uneven refractive index, eventually formed by the presence of metal wires, does not fall on the light-receiving area of tho image sensor.

Thus, the above-explained embodiment can provide a photoelectric converting device (distance measuring solid-state image sensor in this case) which is free from the area of uneven refractive index on the light-receiving area and also from voids in the sealing resin, and which shows superior optical characteristics. Also, said embodiment contributes to an improvement in the production yield of the photoelectric converting devices.

Figure 6:
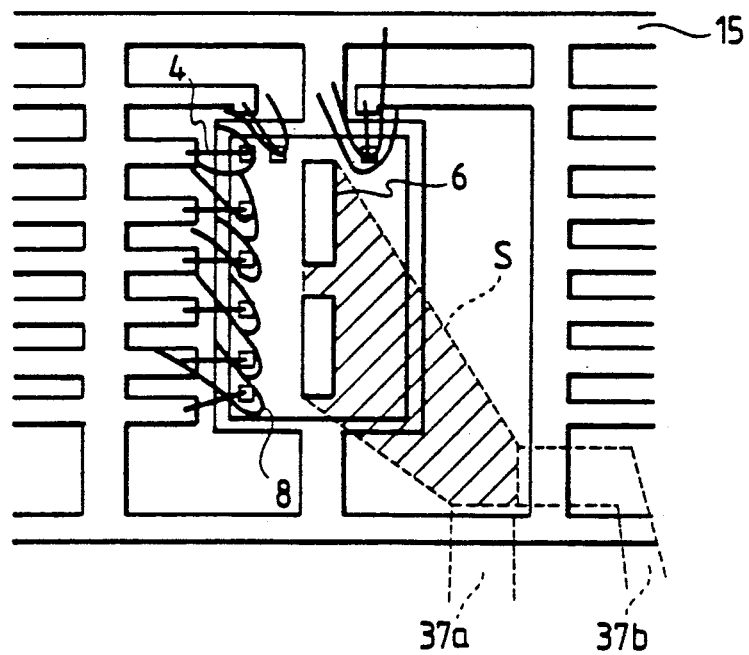
FIG. 6 is a schematic view for explaining the method for producing the photoelectric converting device of the present invention.

FIG. 6 shows another embodiment of the present invention, in which the electrode pads 9 are formed on two neighboring sides of four sides of the solid-state image sensor and are electrically bonded by metal wires such as gold to correspondingly positioned internal leads composed for example of aluminum.

In FIG. 6, the metal wires are not placed on the right-hand side and the lower side, and the gate 37a or 37b is positioned at the approximate center or said two sides. This structure dispenses with the necessity for the additional air vents 13.

In the present embodiment there is described a rectangular solid-state image sensor having electrode pads only on two neighboring sides thereof, but the present invention is not limited by such an embodiment and can assume any structure that can achieve the objects of the present invention.

More specifically, it is required to position the wire bonding area (including electrode pads, metal wires and internal leads), in the cavity for package molding, opposite to the resin injecting gate formed therein across the light-receiving area of the photoelectric converting element. Stated differently, it is required to position the wire bonding area at least outside of an area defined by said gate and the light-receiving area, for example an area S shown in FIG. 6.

Figure 7:
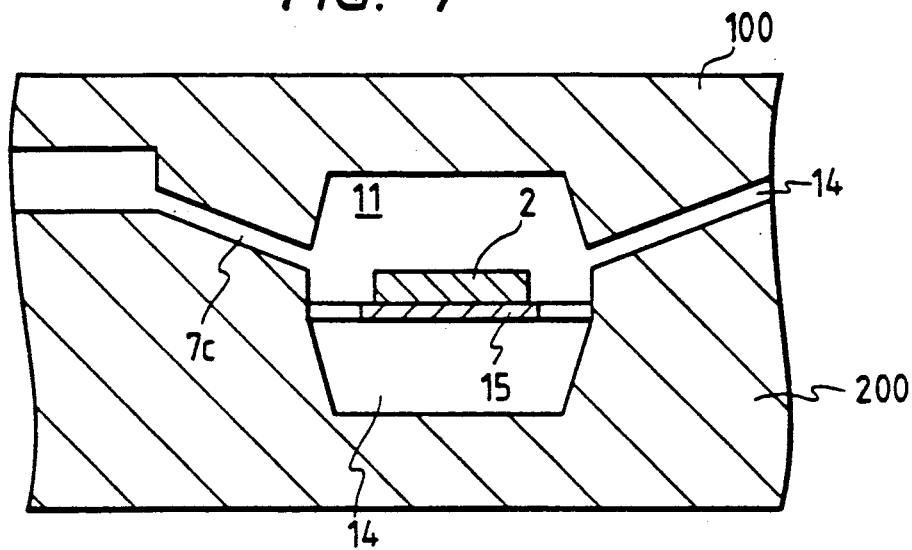
FIG. 7 is a schematic lateral cross-sectional view of an apparatus for producing the photoelectric converting device according to the present invention.

FIG. 7 shows a molding apparatus adapted for exploiting the method of the present invention for producing photoelectric converting devices.

Figure 5B:
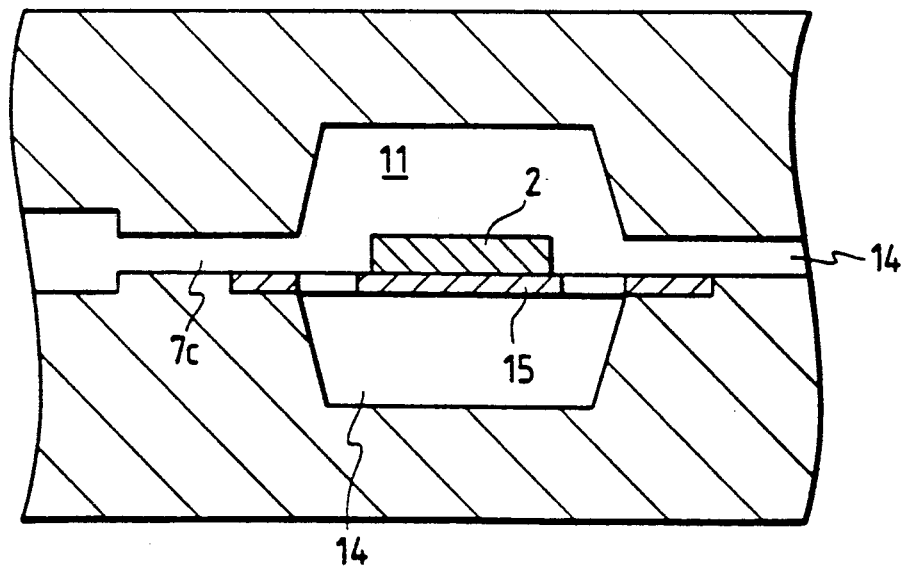
FIG. 5B is a schematic lateral cross-sectional view of an apparatus for producing a photoelectric converting device, corresponding to FIG. 4.

The apparatus shown in FIG. 7 is substantially the same as that shown in FIG. 5B, except that the resin injecting gate 7c is positioned at a certain angle with respect to the light-receiving area of the solid-state image sensor 2, and that the air vents are also positioned at a certain angle with respect to the light-receiving area.

An upper mold 100 and a lower mold 200 constitute a cavity 11 and the gates and air vents mentioned above.

Figure 8:
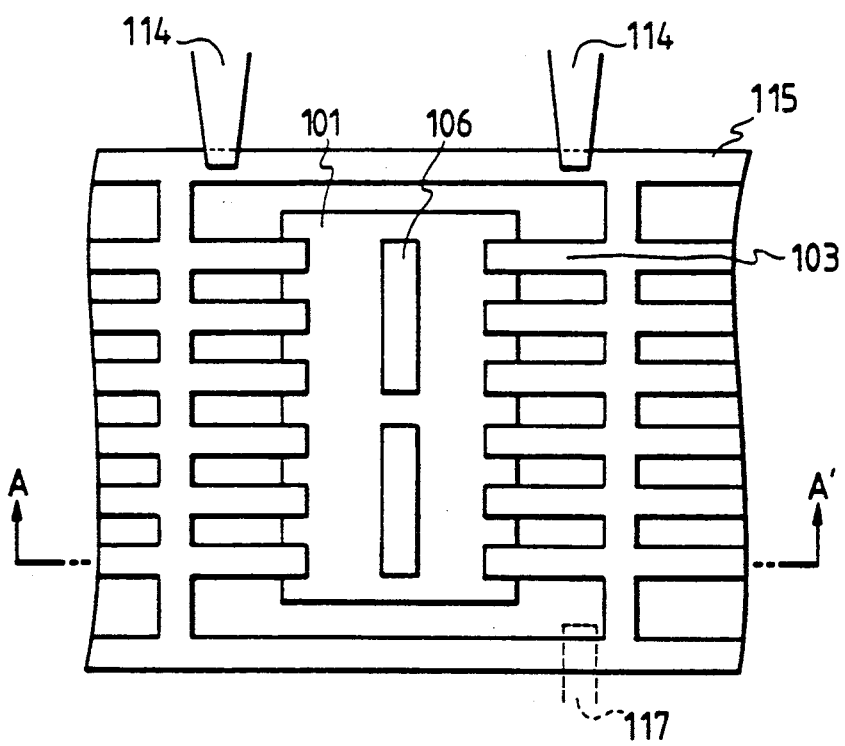
FIG. 8 is a schematic view for explaining the method of producing the photoelectric converting device according to the present invention.
Figure 9:
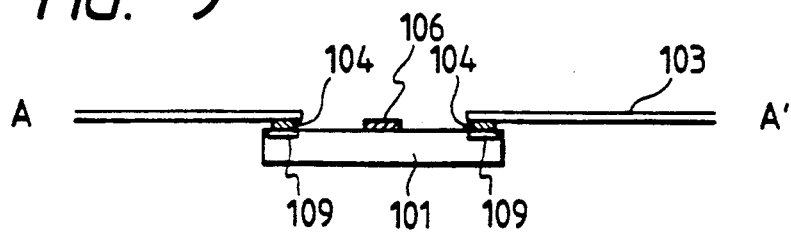
FIG. 9 is a cross-sectional view along a line A—A' in FIG. 8.

FIGS. 8 and 9 illustrate a fourth embodiment of the present invention, showing a part of the method for producing a solid-state image sensor as the photoelectric converting device.

In FIG. 8 and FIG. 9 which is a cross-sectional view along a line A—A' in FIG. 8, there are shown a solid-state image sensor 101, a light-receiving area 106; a lead frame 115; air vents 114 for removing from the cavity at the injection of translucent resin; a gate 117 for injecting said translucent resin; aluminum electrode pads 109 of the solid-state image sensor; and bumps 104.

Now, reference is made to FIGS. 10 to 14 for explaining the steps of the producing method.

Figure 10:
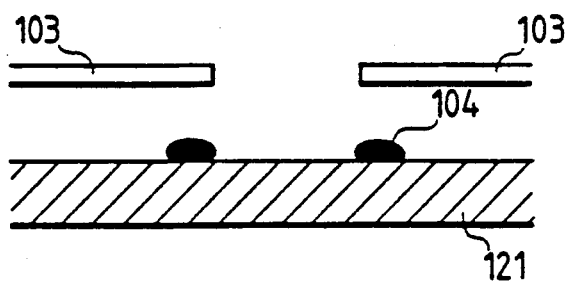
FIGS. 10 to 14 are schematic views showing steps of the method of producing the photoelectric converting device of the present invention.

(Step 1) As shown in FIG. 10, bumps 104 on a bump transfer substrate 121 are aligned with the leads of the lead frame 103. The bumps are generally composed of Au, Cu or Al though they are dependent on the materials of the lead frame.

Figure 11:
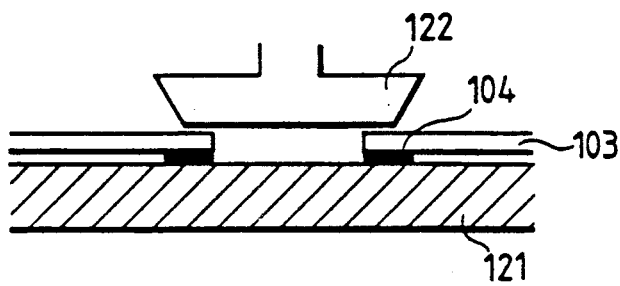
Figure 12:

(Step 2) Heat and pressure are applied by a bump transfer tool 122 as shown in FIG. 11 to transfer the bumps 104 onto the leads 103. FIG. 12 schematically shows the bumps 104 transferred onto the leads 103.

Figure 13:
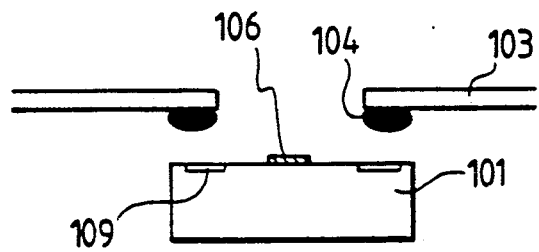

(Step 3) As shown in FIG. 13, the bumps 104 transferred onto the leads 103 are aligned with the aluminum electrode pads 109 of the solid-state image sensor 101.

Figure 14:
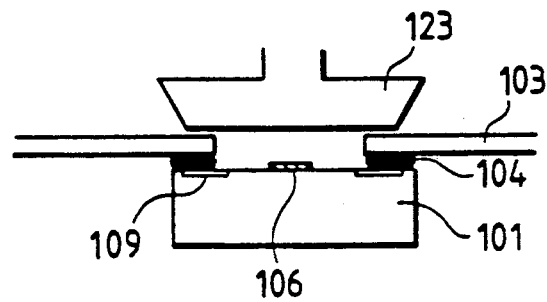

(Step 4) A bonding tool 123 is used as shown in FIG. 14 to bond the aluminum electrode pads 109 and the leads 103 electrically and mechanically through the bumps 104.

(Step 5) Thereafter, a desired portion of the lead frame 103, including the above-mentioned components, is placed in a mold, and transparent epoxy resin is injected from the gate 116.

The photoelectric converting device prepared through the steps 1 to 5 does not show an area of uneven refractive index, owing to the absence of the metal wires.

The leads 103 employed in the present embodiment should have a carefully controlled thickness. In the present embodiment, metal wires are excluded in order to avoid the formation of an area of uneven refractive index, but such an area may still be formed if the thickness of the leads 103 exceeds a certain value. Experiments of the present inventor indicate that the thickness of the lead 103, including that of the bump 104, should not preferably exceed 0.1 mm. For comparison, the length of metal wires is generally in a range of 0.3–0.7 mm from the surface of the element where the aluminum electrode pads are present.

It will be understood that the use of a considerably thin lead is desirable.

Figure 15:
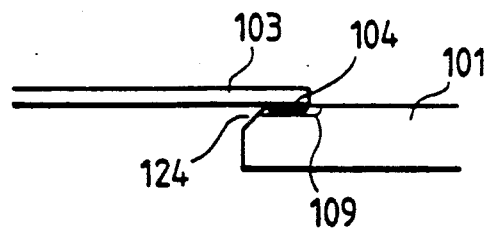
FIG. 15 is a schematic partial magnified view showing the method of producing the photoelectric converting device of the present invention.

In the following there will be explained a fifth embodiment of the present invention. The method of the 4th embodiment can prevent the formation of an area of uneven refractive index, but may cause a chipping as indicated by 124 in FIG. 15 unless the thickness of the bumps 104 and the method of use of the bonding tool 123 are well controlled, as the leads 104 are completely parallel to the surface of the photoelectric converting element (solid-state image sensor 101 in this case). Such a defect can be avoided by controlling the conditions of bonding with the bonding tool 123, but precise control of the production steps will be indispensable in such case.

Figure 16:
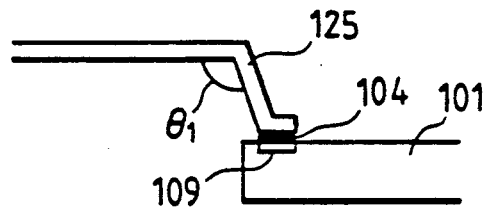
FIGS. 16 and 17 are schematic partial magnified views of a photoelectric converting device of the present invention.
Figure 17:
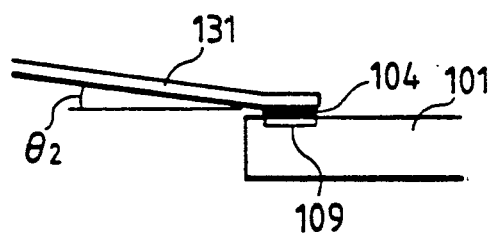

Such precise control can be dispensed with by the use of a lead frame as shown in FIG. 16. It is to be noted that the angle $\theta_1$ of the leads 125 has to be sufficiently large and that the bent part of the leads 125 has to be sufficiently apart from the bonding portion between the element 101 and leads 125. Particularly a small angle $\theta_1$ leads to the formation of the area of uneven refractive index, as in the case with metal wires. Experiments of the present inventor indicate that the formation of the area of uneven refractive index can be prevented by $\theta_1$ selected equal to or larger than 160° but smaller than 180°. It is also possible to prevent the formation of the area of uneven refractive index by forming, as shown in FIG. 17, only the bonding portion of the element 101 and the leads 131 through the bumps 104 parallel to the element 101 and inclining the main part of the lead 131 by a small angle $\theta_2$. Experimentally, satisfactory results have been obtained with an angle $\theta_2$ not exceeding 20°. Also, even if the angle $\theta_1$ shown in FIG. 16 or $\theta_2$ shown in FIG. 17 cannot be selected at a desired value, the formation of the area of uneven refractive index can be prevented by placing the injecting gate 126 at the center opposite to the air vents 114, since the translucent resin reaches the leads 131 after passing the light-receiving area 106. In this manner the area with uneven refractive index does not lie on said light-receiving area 106.

Figure 18:
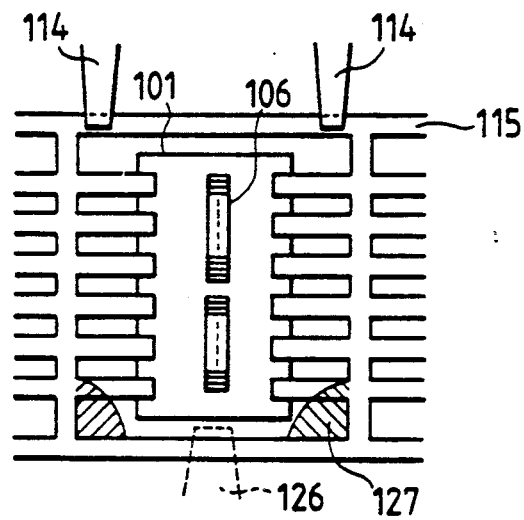
FIG. 18 is a schematic view showing the method of producing the photoelectric converting device of the present invention.
Figure 19:
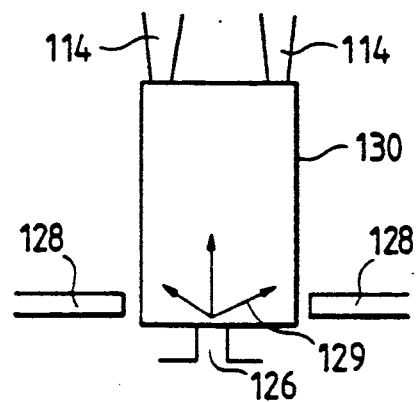
FIG. 19 is a schematic plan view showing an apparatus for producing the photoelectric converting device according to the present invention.

In this case, the use of additional air vents 128, as shown in FIG. 18, is desirable, as voids of translucent resins may develop in positions 127 shown in FIG. 18. In FIG. 19, 130 indicates a mold.

In the above-explained method for producing the photoelectric converting device, the transparent epoxy resin can be injected by casting, in which liquid resin is injected into a mold containing the element and is solidified at room temperature or by heating,. or by transfer molding in which resin in powdered or solid state is preheated, then fused under heat and pressure, injected into a mold, and solidified by continued heating and pressurizing.

In the foregoing embodiments, transparent epoxy resin hardenable with an acid anhydride is employed, but the method of the present invention is applicable to other translucent resins.

Also, CCD line sensors have been employed as the solid-state image sensor in the foregoing embodiments, but same advantages can naturally be obtained with MOS image sensors.

Furthermore, the foregoing embodiments may be suitably combined.

The method of the present invention is particularly preferably employable for a photoelectric converter, as disclosed in the U.S. Pat. No. 4,686,554 to Ohmi et al., for providing an output signal which varies as a function of light energy received thereby, comprising a transistor having a control electrode region adapted to accumulate carriers in response to the received light energy and main electrode regions, one of which is connected to an output circuit which includes a capacitive element; and read-out means for reading out a signal dependent on the accumulated carriers; and characterized in that the control electrode region is coupled to a potential source which controls the potential of the control electrode region preferentially to the main electrodes and forward biases the junction of said control and one main electrode regions during read-out and in that the output signal is produced as a voltage across the capacitive element.

As explained in the foregoing, the present invention provides a method for producing a photoelectric converting device which is free from an area of uneven refractive index in the photoelectric converting portion and is provided with excellent optical characteristics.

I claim:

1. A method for producing a resin-sealed photoelectric converting device having (1) a photoelectric converting element, and (2) wires for electrically connecting electrodes of the photoelectric converting element with lead electrodes, a transparent portion being present on a photoelectric converting portion of said photoelectric converting element, said method comprising steps of:
   placing said photoelectric converting element and said lead electrodes in a mold cavity having a gate for injecting resin; and
   injecting resin from said gate and guiding the injected resin which bypasses said wires to an area away from said photoelectric converting portion, and sealing the entire photoelectric converting element with the injected resin.

2. A method according to claim 1, wherein the gate is positioned at the approximate center of a side of said photoelectric converting element not provided with said element electrodes connected to said wires.

3. A method according to claim 2, wherein air vents for eliminating the air from the mold cavity are provided at an opposite side of the cavity from said side of said photoelectric converting element not provided with said element electrodes.

4. A method according to claim 2, wherein air vents for eliminating the air from the mold are provided at left and right lateral sides of said mold.

5. A method according to claim 4, wherein said air vents are provided at said left and right lateral sides substantially adjacent said injecting gate.

6. A method according to claim 5, wherein the position of said air vents satisfies a relation:

$$3m \leq l$$

wherein l is the length of one said lateral side, and m is a distance to one said air vent along said left or right lateral sides.

7. A method according to claim 5, wherein the position of said air vents satisfies a relation $$2m \leq n$$

wherein n is the length of said cavity in a direction perpendicular to said left and right lateral sides.

8. A method according to claim 6, wherein the position of said air vents satisfies a relation $$2m \leq n$$

wherein n is the length of said cavity in a direction perpendicular to said left and right lateral sides.

9. A method according to claim 1, wherein said injecting gate is formed in a position corresponding to a corner of two neighboring sides of said photoelectric converting element, said two neighboring sides not having electrodes connected to the wires.

10. A method according to claim 9, wherein plural injecting gates are provided.

11. A method according to claim 1, wherein said resin is injected by a transfer molding method.

12. A method according to claim 1, wherein said resin is injected by a casting method.

13. A method according to claim 1, wherein a face of said photoelectric converting element bearing said photoelectric converting portion is substantially circular or oval.

14. A method according to claim 1, wherein a face of said photoelectric converting element bearing said photoelectric converting portion is substantially circular or oval.

15. A method for producing a resin-sealed photoelectric converting device having (1) a photoelectric converting element, and (2) wires for electrically connecting electrodes of said photoelectric converting element with lead electrodes, a transparent portion being present on a photoelectric converting portion of said photoelectric converting element, said method comprising the steps of:
   placing said wires so that they are not between a gate for injecting resin and said photoelectric converting portion; and
   sealing said device and the entire photoelectric converting element with resin by injecting the resin through said gate.

16. A photoelectric converting device produced according to the method of claim 1.

17. A photoelectric converting device according to claim 16, wherein said device comprises a photosensor.

18. A photoelectric converting device according to claim 16, wherein said device comprises a light-emitting device.

19. A photoelectric converting device produced according to the method of claim 15.

20. A photoelectric converting device according to claim 19, wherein said device comprises a photosensor.

21. A photoelectric converting device according to claim 19, wherein said device comprises a light-emitting device.

22. A method for producing a resin-sealed photoelectric converting device having (1) a photoelectric converting element, and (2) a bonding portion for electrically connecting electrodes of said photoelectric converting element with lead electrodes, a transparent portion being present on a photoelectric converting portion of said photoelectric converting element, said method comprising the steps of:

pressure fixing said photoelectric converting element electrodes and said lead electrodes through bumps;

placing said photoelectric converting element and said lead electrodes in a cavity provided with a gate for injecting resin; and injecting resin from said injecting gate thereby effecting resin sealing of the entire photoelectric converting portion.

23. A method according to claim 22, wherein the thickness of said lead electrodes substantially equal to or less than 0.1 mm.

24. A method according to claim 22, wherein said at least one of said lead electrodes has a bent portion away from said bonding portion.

25. A method according to claim 24, wherein the angle of said bent portion is equal to or larger than 160° and is smaller than 180°.

26. A method according to claim 22, wherein said lead electrode has an inclination not exceeding 20° with respect to said bonding portion.

* * * * *

UNITED STATES PATENT AND TRADEMARK OFFICE
CERTIFICATE OF CORRECTION

PATENT NO. : 5,079,190

DATED : January 7, 1992

INVENTOR(S) : Akio MIHARA

It is certified that error appears in the above-identified patent and that said Letters Patent is hereby corrected as shown below:

COLUMN 2:

Line 12, "a" should be deleted; and
    Line 27, "covnerting" should read --converting--.

COLUMN 3:
    Line 57, "wherein," should read --wherein--.

COLUMN 4:
    Line 26, "indicates" should read --indicated--; and
    Line 68, "tho" should read --the--.

COLUMN 5:
    Line 17, "or" should read --of--; and
    Line 53, "sensor 101," should read --sensor 101;--.

COLUMN 6:
    Line 9, "frame 103," should read --frame 115,--;
    Line 11, "gate 116." should read --gate 117.--;
    Line 24, "preferebly" should read --preferably--; and
    Line 36, "leads 104" should read --leads 103--.

UNITED STATES PATENT AND TRADEMARK OFFICE
CERTIFICATE OF CORRECTION

PATENT NO. : 5,079,190

DATED : January 7, 1992

INVENTOR(S) : Akio MIHARA

It is certified that error appears in the above-identified patent and that said Letters Patent is hereby corrected as shown below:

<u>COLUMN 7</u>:

Line 9, "heating,." should read --heating,--.

<u>COLUMN 8</u>:
Line 19, "sides." should read --side.--;
Line 21, "relation" should read --relation:--;
Line 28, "relation" should read --relation:--;
Line 47, "circular or" should read --rectangular.--; and
Line 48, "oval." should be deleted.

Signed and Sealed this

Eighth Day of June, 1993

Attest:

MICHAEL K. KIRK

Attesting Officer

Acting Commissioner of Patents and Trademarks